(12) United States Patent
Raj et al.

(10) Patent No.: US 7,586,100 B2
(45) Date of Patent: Sep. 8, 2009

(54) CLOSED LOOP CONTROL AND PROCESS OPTIMIZATION IN PLASMA DOPING PROCESSES USING A TIME OF FLIGHT ION DETECTOR

(75) Inventors: Deven M. Raj, Wenham, MA (US); Ludovic Godet, Wakefield, MA (US); Bernard Lindsay, Danvers, MA (US); Timothy Miller, Ipswich, MA (US); George Papasouliotis, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 94 days.

(21) Appl. No.: 12/029,710

(22) Filed: Feb. 12, 2008

(65) Prior Publication Data

US 2009/0200461 A1 Aug. 13, 2009

(51) Int. Cl.
*H01J 49/40* (2006.01)
*G01N 27/26* (2006.01)
*H01L 21/31* (2006.01)
*H01L 21/469* (2006.01)

(52) U.S. Cl. .................... 250/423 R; 250/424; 250/425; 250/397; 250/492.3; 315/111.21; 118/620; 438/513; 356/316

(58) Field of Classification Search ............. 250/423 R, 250/424, 425, 397, 492.3; 315/111.21; 118/620; 438/513
See application file for complete search history.

(56) References Cited

U.S. PATENT DOCUMENTS 7,453,059 B2 * 11/2008 Koo et al. .................... 250/287

| | | |
|---|---|---|
| 2005/0205212 A1 | 9/2005 | Singh et al. |
| 2006/0236931 A1 | 10/2006 | Singh et al. |
| 2007/0084564 A1 | 4/2007 | Gupta et al. |
| 2007/0087574 A1 * | 4/2007 | Gupta et al. ................. 438/758 |
| 2007/0170867 A1 | 7/2007 | Persing et al. |
| 2007/0224840 A1 | 9/2007 | Renau et al. |
| 2007/0227231 A1 | 10/2007 | Koo et al. |
| 2008/0248597 A1 * | 10/2008 | Qin et al. ....................... 438/5 |
| 2009/0084987 A1 * | 4/2009 | Godet et al. ............. 250/492.3 |
| 2009/0104761 A1 * | 4/2009 | Jeon et al. .................... 438/513 |

OTHER PUBLICATIONS

Walther, Plasma Doping With Electronically Controllable Implant Angle, U.S. Appl. No. 11/566,418, filed Dec. 4, 2006.

(Continued)

*Primary Examiner*—Nikita Wells

(57) ABSTRACT

A method of controlling a plasma doping process using a time-of-flight ion detector includes generating a plasma comprising dopant ions in a plasma chamber proximate to a platen supporting a substrate. The platen is biased with a bias voltage waveform having a negative potential that attracts ions in the plasma to the substrate for plasma doping. A spectrum of ions present in the plasma is measured as a function of ion mass with a time-of-flight ion detector. The total number ions impacting the substrate is measured with a Faraday dosimetry system. An implant profile is determined from the measured spectrum of ions. An integrated dose is determined from the measured total number of ions and the calculated implant profile. At least one plasma doping parameter is modified in response to the calculated integrated dose.

25 Claims, 3 Drawing Sheets

OTHER PUBLICATIONS

Hertel, et al., Plasma Source With Liner For Reducing Metal Contamination, U.S. Appl. No. 11/623,739, filed Jan. 16, 2007.

Miller, et al., Multi-Step Plasma Doping With Improved Dose Control, U.S. Appl. No. 11/676,069, filed Feb. 16, 2007.

Singh, et al., Plasma Doping With Enhanced Charge Neutralization, U.S. Appl. No. 11/771,190, filed Jun. 29, 2007.

Walther, Conformal Doping Using High Neutral Density Plasma Implant, U.S. Appl. No. 11/774,587, filed Jul. 7, 2007.

Gupta, et al., Plasma Doping System With In-Situ Chamber Condition Monitoring, U.S. Appl. No. 11/877,312, filed Oct. 23, 2007.

Jeon, et al., Plasma Doping System with Charge Control, U.S. Appl. No. 11/875,062, filed Oct. 19, 2007.

* cited by examiner

CLOSED LOOP CONTROL AND PROCESS OPTIMIZATION IN PLASMA DOPING PROCESSES USING A TIME OF FLIGHT ION DETECTOR

The section headings used herein are for organizational purposes only and should not to be construed as limiting the subject matter described in the present application.

BACKGROUND OF THE INVENTION

Plasma processing has been widely used in the semiconductor and other industries for many decades. Plasma processing is used for tasks such as cleaning, etching, milling, and deposition. More recently, plasma processing has been used for doping. Plasma doping is sometimes referred to as PLAD or plasma immersion ion implantation (PIII). Plasma doping systems have been developed to meet the doping requirements of state-of-the-art electronic and optical devices.

Plasma doping systems are fundamentally different from conventional beam-line ion implantation systems that accelerate ions with an electric field and then filter the ions according to their mass-to-charge ratio to select the desired ions for implantation. In contrast, plasma doping systems immerse the target in a plasma containing dopant ions and then bias the target with a series of negative voltage pulses. The term "target" is defined herein as the workpiece being implanted, such as a substrate or wafer being ion implanted. The negative bias on the target repels electrons from the target surface thereby creating a sheath of positive ions. The electric field within the plasma sheath accelerates ions toward the target thereby implanting the ions into the target surface.

Conventional beam-line ion implantation systems that are widely used in the semiconductor industry have excellent process control and also excellent run-to-run uniformity. Conventional beam-line ion implantation systems also provide highly uniform doping across the entire surface of state-of-the art semiconductor substrates. Plasma doping systems for the semiconductor industry must also have a very high degree of process control. However, in general, the process control of plasma doping systems is not as good as conventional beam-line ion implantation systems.

BRIEF DESCRIPTION OF THE DRAWINGS

The invention, in accordance with preferred and exemplary embodiments, together with further advantages thereof, is more particularly described in the following detailed description, taken in conjunction with the accompanying drawings. The drawings are not necessarily to scale, emphasis instead generally being placed upon illustrating principles of the invention.

DETAILED DESCRIPTION

Figure 1:
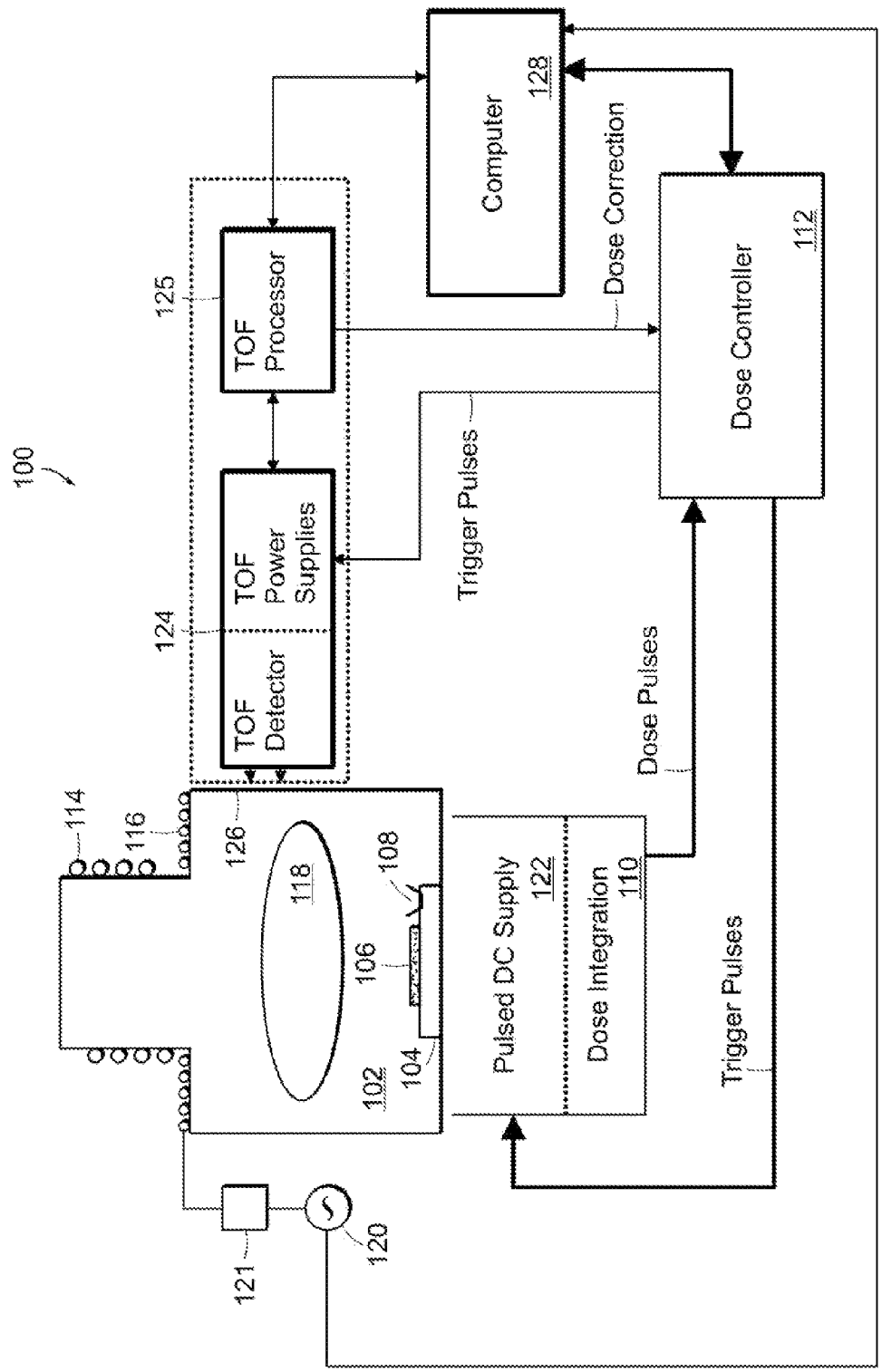
FIG. 1 illustrates a schematic block diagram of a plasma doping system with closed loop process control and optimization according to the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

It should be understood that the individual steps of the methods of the present invention may be performed in any order and/or simultaneously as long as the invention remains operable. Furthermore, it should be understood that the apparatus and methods of the present invention can include any number or all of the described embodiments as long as the invention remains operable.

The present teachings will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein. For example, although the present invention is described in connection with a plasma doping system, the methods and apparatus for monitoring chamber conditions applies to many other types of processing systems.

Three dimensional device structures are now being developed to increase the available surface area of ULSI circuits as well as to extend the device scaling to sub 65 nm technology nodes. For example, three dimensional trench capacitors used in DRAMs, and numerous types of devices using vertical channel transistors, such as the FinFETs (Double or Triple gate) and recessed channel array transistors (RCAT) are being developed in research laboratories. Many of these three dimensional devices require very precise control of the plasma doping process. In addition, numerous other types of modern electronic and optical devices and nanotechnology microstructures require very precise control of the plasma doping process.

It is difficult to precisely control plasma doping processes for many reasons. For example, deposition and etching including some physically sputtering and chemical etching occurs with the ion implantation. Also, there can be a significant ion implant energy distribution due to many factors, such as the presence of multiple ion species, collisions between ions, non uniformities in the plasma sheath, presence of secondary electron emissions, displacements currents formed due to parasitic impedances, and the application of non-ideal bias pulses. In addition, the high voltages applied to the wafer during ion implantation interfere with some instrumentation and measurement techniques.

The present invention relates to methods and apparatus for monitoring plasma processing conditions during plasma doping. In particular, the present invention relates to methods and apparatus for in-situ monitoring and optimization of plasma conditions during plasma processing. The term "in-situ monitoring" refers to monitoring while performing the plasma processing.

In known plasma doping processes, the implant dose is often monitored using a Faraday cup dosimetry system that measures the total charge proximate to the substrate being processed. In many plasma processing systems, most of the plasma ions are singly charged ions. The charge accumulated in the Faraday cup dosimetry system is, therefore, a good metric of the total count of ions impacting the Faraday cup. However, the signal generated by the Faraday cup dosimetry system does not indicate information useful for process control in plasma doping systems. For example, the signal generated by the Faraday cup dosimetry system does not indicate which ions are being implanted into the substrate. In addition, the signal generated by the Faraday cup dosimetry system does not indicate the percentage of each type of ion being implanted. Furthermore, the signal generated by the Faraday cup dosimetry system does not indicate the ratio(s) of particular ions being implanted to other ions being implanted.

The apparatus and methods of the present invention use a time-of-flight (TOF) ion detector to measure particular ions in the plasma. Time-of-flight (TOF) ion detectors accelerate ions across a nearly constant potential and measure the flight time of ions from their origination at the source to a detector. Since the kinetic energy per charge of an ion is nearly constant, heavier ions move more slowly and arrive at the detector later in time than lighter ions. Time-of-flight (TOF) ion detectors can be calibrated by measuring the flight times of ions with known mass-to-charge ratio values. Thus, the flight time of an unknown ion can be measured and this measurement can be used to calculate the mass-to-charge ratio value.

Therefore, data from the TOF ion detector can be used to differentiate ions in the plasma. Differentiation of ions in the plasma allow for optimization of the plasma process including optimization of the total implanted dose and optimization of the implant junction depth. In addition, differentiation of ions in the plasma allows for a determination of the process chamber condition and can be used for fault detection.

The methods and apparatus of the present invention measure data from a TOF ion detector and use the TOF data to monitor and control plasma doping processes. In some embodiments, the data from the TOF ion detector is used with data from a Faraday cup dosimetry system to monitor and control plasma doping processes. More specifically, the methods and apparatus of the present invention perform closed-loop process control with data obtained from a TOF ion detector. In some embodiments, closed-loop process control is also obtained with data from a Faraday cup dosimetry system. In various embodiments, the data obtained with the TOF ion detector is used to determine correlations between ion ratio(s) derived from the time-of-flight signal and from other process performance data. Utilization of these correlations allows the process engineer to optimize the process for numerous process parameters, such as implant dose and implant depth.

FIG. 1 illustrates a schematic block diagram of a plasma doping system 100 with closed loop process control and optimization according to the present invention. Any type of plasma doping system can be used with the methods and apparatus for closed loop process control and optimization according to the present invention. For example, one such plasma doping system is described in U.S. patent application Ser. No. 10/905,172, filed on Dec. 20, 2004, entitled "RF Plasma Source with Conductive Top Section," which is assigned to the present assignee. The entire specification of U.S. patent application Ser. No. 10/905,172 is incorporated herein by reference.

The plasma doping system 100 includes a plasma chamber 102. The plasma chamber 102 includes a platen 104 that holds a substrate 106 or workpiece so that it can be doped in the system 100. The substrate 106 is electrically connected to the platen 104. The plasma doping system 100 also includes a Faraday dosimetry system that measures the total charge by counting the number of ions that impact the substrate 106.

The Faraday dosimetry system includes a Faraday cup 108 that is positioned in relatively close proximity to the substrate 106 so that the number of ions impacting the Faraday cup 108 is substantially the same as the number of ions impacting the substrate 106. In some embodiments, the Faraday cup 108 is embedded into the platen 104 so that it is the same distance from the plasma source as the substrate 106. The Faraday dosimetry system also includes dose integration electronics 110 that receives a current signal generated by the Faraday cup 108 and that generates a train of digital pulses which represent a metric of the number of ions impacting the Faraday cup 108. The Faraday dosimetry system can also bleed charge from the Faraday cup 108 if necessary to improve the accuracy of the instrument. An output of the dose integration electronics 110 is electrically connected to an input of a dose controller 112.

The chamber 102 includes a first 114 and a second coil 116 that when energized form a plasma 118. At least one of the first and the second coil 114, 116 is an active antenna coil that is connected to a power source 120 through an impedance matching network 121. In some embodiments, one of the first and the second coils 114, 116 is a parasitic coil or parasitic antenna. The term "parasitic antenna" is defined herein to mean an antenna that is in electromagnetic communication with an active antenna, but that is not directly connected to a power supply. In other words, a parasitic antenna is not directly excited by a power supply, but rather is excited by an active antenna positioned in electromagnetic communication with the parasitic antenna. In some embodiments of the present invention, one end of the parasitic antenna is electrically connected to ground potential in order to provide antenna tuning capabilities. In this embodiment, the parasitic antenna includes a coil adjuster that is used to change the effective number of turns in the parasitic antenna coil. Numerous different types of coil adjusters, such as a metal short, can be used.

A bias voltage power supply 122 is used to bias the substrate 106 for doping. An output of the bias voltage power supply 122 is electrically connected to the platen 104. The bias voltage power supply 122 generates a bias voltage at an output that biases the platen 104 and the substrate 106 so that dopant ions in the plasma are extracted from the plasma and impact the substrate 106. In various embodiments, the bias voltage power supply 122 can be a DC power supply, a pulsed power supply, or a RF power supply. The bias voltage power supply 122 includes a control input that receives trigger pulses from the dose controller 112. The trigger pulses instruct the bias voltage power supply 120 to apply a high voltage pulse to the platen 104. In some embodiments, the dose controller 112 instructs the bias voltage power supply 122 to generate a bias voltage waveform with a particular voltage, duty cycle, and pulse repetition rate.

The plasma doping system 100 includes a TOF ion detector 124 according to the present invention. The TOF ion detector 124 includes an input port 126 that is coupled to the chamber 102. The input port 126 is exposed to the plasma 118 so as to receive ions present in the chamber 102. The TOF ion detector 124 also includes a control input that is electrically connected to the dose controller 112. Trigger signals generated by the dose controller 112 are applied to the control input of the TOF ion detector 124. The trigger signals instruct the TOF ion detector 124 to detect a sample of the ions at the input port 126 by applying a short accelerating pulse to ions present at the input port 126 so that these ions all acquire the same energy. The TOF ion detector 124 then generates electrical signals that represent ion detection as a function of the time that the ions take to traverse a known distance.

The TOF ion detector 124 can be constructed to be physically very small in size so that it can be placed at any convenient location in the process chamber 102. Numerous types of TOF ion detectors can be used with the methods and apparatus for closed loop process control and optimization according to the present invention. A TOF ion detector according to the present invention is described in more detail in FIG. 2.

A TOF ion detector processor 125 receives the electrical signals generated by the TOF ion detector 124 that represent ion detection as a function of the time that the ions take to traverse a known distance. The processor 125 then maps the ion's flight time to the type of ion using well known methods for time-of-flight spectrometry. The data generated by the ion sensor is a spectrum of relative amplitudes of the plasma ion population as a function of ion mass. In addition, the processor 125 includes an output that is electrically connected to a control input of the dose controller 112. The processor 125 can generate a dose correction signal at the output that instructs the dose controller 112 to apply the desired number of trigger pulses to the control input of the bias voltage power supply 122.

The plasma doping system 100 also includes a process control computer 128 that controls the operation of the plasma doping system 100. The process control computer 128 includes a bi-directional interface that is connected to the TOF ion detector processor 125. The computer 128 receives data from the processor 125. The data from the processor 125 can be used by the computer 128 to control the operation of the TOF ion detector 124. For example, data from the processor 125 can be used by the computer 128 to determine if the operating parameters of the TOF ion detector 124, such as the parameters of the ion extraction pulse and the detector voltage need to be changed. The computer 128 then generates signals that instruct the processor 125 to change the operating parameters of the TOF ion detector 124 to achieve certain process goals.

In addition, the process control computer 128 includes a bidirectional interface that is connected to the dose controller 112. The computer 128 communicates directly with the dose controller 112 to provide recipe information and control information to the dose controller 112. For example, at the start of a process, the computer 112 generates signals that instruct the dose controller 112 to initiate plasma doping. The computer 128 also generates signals that instruct the dose controller 112 to initially generate a certain number of trigger pulses. The trigger pulses instruct the bias voltage power supply 122 to apply high voltage pulses to the platen 104 which result in the implantation of a predetermined dose to the substrate 106. The process control computer 128 also generates signals to instruct the dose controller 112 that the desired dose has been implanted or to abort the process because a process fault condition has occurred.

The dose controller 112 also communicates directly with the process control computer 128 to provide process status information from the Faraday dosimetry system, TOF ion detector 124, and other sensor information to the computer 128. For example, during processing, the dose controller 112 can continually update the computer 128 with current data from the Faraday dosimetry system that indicates the total number ions impacting the surface of the substrate and the type and ratios of particular ions in the plasma 118.

In some embodiments, the process control computer 128 includes an interface that is connected to the RF power source 120. In these embodiments, the computer 128 communicates with the RF power source 120 to provide instructions to start and stop the plasma 118. In addition, the computer 128 communicates directly with the RF power source 120 to provide instructions to set and change plasma power levels.

In some embodiments, the process control computer 128 includes an interface that is connected to at least one of a process gas controller and a chamber pressure controller. In these embodiments, the computer 128 communicates with the process gas controller and/or the chamber pressure controller to provide instructions to change pressure conditions and/or gas flow rates.

The dose controller 112 is a high-speed controller or process that receives control signals from the dose integration electronics 110, TOF ion detector processor 125 and the process computer 128 as described herein. In addition, the dose controller 112 generates trigger pulses that instruct the bias voltage power supply 122 to apply a high voltage pulse to the platen 104 as described herein. The dose controller 112 also generates trigger pulses for the TOF ion detector 124 that instruct the TOF ion detector 124 to detect ions at the input port 126. One skilled in the art will appreciate that the dose controller 112 can be part of the process control computer or can be a separate dedicated computer.

Figure 2:
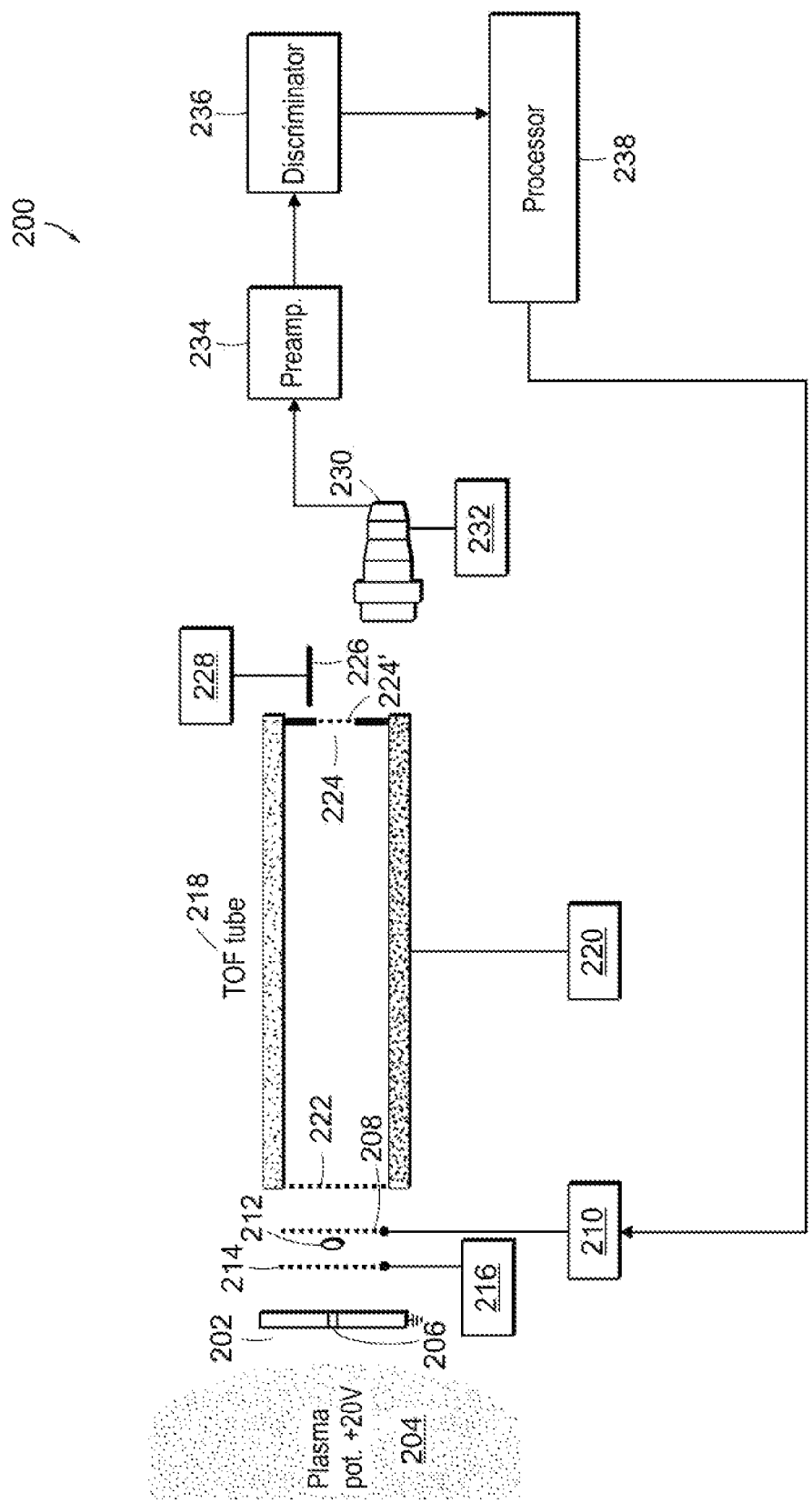
FIG. 2 illustrates a schematic diagram of a time-of-flight (TOF) ion detector that can be used with the plasma doping system with closed loop process control and optimization according to the present invention.

FIG. 2 illustrates a schematic diagram of a time-of-flight (TOF) ion detector 200 that can be used with the plasma doping system 100 with closed loop process control and optimization according to the present invention. The TOF ion detector 200 includes an input port 202 that is exposed to the plasma 204 in the plasma chamber 102 (FIG. 1). The input port 202 includes an aperture 206 that samples a portion of the ions. For example, the aperture 206 can be an approximately circular-type aperture with a diameter that is on order of 100 microns. In the embodiment shown, the aperture 206 is at ground potential. However, numerous bias configurations are possible.

The TOF ion detector 200 also includes a first mesh grid 208. In some embodiments, an electrostatic lens can be used instead of a mesh grid. For example, the first mesh grid 208 can have a center-to-center spacing that is on order of a few millimeters. In one specific embodiment, the center-to-center spacing of the first mesh grid is about 2.7 mm. A first voltage power supply 210 includes an output that is electrically connected to the first mesh grid 208. For example, in one embodiment, the first voltage power supply 210 applies a positive DC bias voltage of about 100 Volts to the first mesh grid 208. The positive DC voltage establishes a barrier potential that stores ions from the import port 202 in a region 212 that is adjacent to the first mesh grid 208.

The TOF ion detector 200 also includes a second mesh grid 214. In some embodiments, an electrostatic lens can be used instead of a mesh grid. For example, the second mesh grid 214 can have a center-to-center spacing that is on order of a few millimeters. In many embodiments, the mesh grid pattern of the second mesh grid 214 matches the mesh grid pattern of the first grid 208, which in one specific embodiment, has a center-to-center spacing that is about 2.7 mm.

A second voltage power supply 216 includes an output that is electrically connected to the second mesh grid 214. The second voltage power supply 216 is a high voltage pulsed power supply that provides a high voltage positive pulse to the second mesh grid 214. The high voltage pulse extracts ions in the region 212 through the first mesh grid 208 and into a TOF flight tube 218. The high voltage pulse is a relatively short pulse that reduces the distribution of ion extraction times into the TOF flight tube. For example, the short pulse can be on order of about one microsecond long. In some methods of operation, the short pulse is synchronized with the ion implant pulse.

The flight tube 218 is a field free drift region with a known distance that transports the ions extracted from the region 212 with the short pulse. The ions are separated in time according to their mass-to-charge ratio while they traverse the flight tube 218. The flight tube 218 must be long enough so that ions of different mass-to-charge ratio can be detected at time intervals that can be accurately measured by conventional electronics. For example, in one specific embodiment, the flight tube 218 is approximately 28 cm long.

A bias voltage power supply 220 is electrically connected to the flight tube 218. For example, in one specific embodiments, the bias voltage power supply 220 biases the flight tube 218 so that it is at a constant floating negative potential of about 300 volts. In some embodiments, a mesh grid 222 is positioned at the input of the flight tube 218. Also, in some embodiments, an aperture 224 is positioned at the output of the flight tube 218 so that ions exiting the aperture 224 have substantially similar flight paths. An exit grid 224' can be positioned in the aperture 224 as shown in FIG. 2.

A deflection plate 226 is positioned proximate to the aperture 224 of the flight tube 218. A bias voltage power supply 228 biases the deflection plate 226 at a high positive voltage.

In one specific embodiment, the deflection plate 226 is biased at positive 250 volts. The deflection plate 226 deflects ions exiting the flight tube 218 into an ion detector 230.

Numerous types of ion detectors can be used with the TOF ion detector 200. For example, the ion detector 230 can be a channel electron multiplier. Channel electron multipliers include an emissive layer that generates secondary electrons which amplify the detection of ions. A high voltage power supply 232 is electrically connected to the ion detector 230. The high voltage power supply 232 biases the channel electron multiplier at a high negative voltage. For example, the high voltage power supply 232 can bias the channel electron multiplier at negative 2500 volts. The ion detector 230 can include a pre-amplifier 234 that amplifies the ion detection signal so that it can be processed by standard electronics. Also, the ion detector 230 can include a discriminator 236 that detects the short pulses from the channel electron multiplier and that rejects noise.

In some embodiments, an ion reflector (not shown) is positioned at the end of the flight tube 218. Ion reflectors provide a more accurate measurement of the relative time that ions of different mass-to-charge ratio are detected. Ion reflectors include a field-free drift region that is used to compensate for the effects of the initial kinetic energy distribution by modifying the flight path of the ions. A first detector is used for detecting ions with the ion reflector de-energized. A second detector is used for detecting ion with the ion reflector energized. The ion reflector includes a series of rings biased with potentials that increase to a level slightly greater than the ion accelerating voltage.

As the ions penetrate the ion reflector, they are decelerated until their velocity in the direction of the field becomes zero. At the zero velocity point, the ions reverse direction and are accelerated back through the reflector. The ions exit the reflector with energies identical to their incoming energy but with velocities in the opposite direction. Ions with larger energies penetrate the reflector more deeply and consequently will remain in the ion reflector for a longer time. The potentials of the series of rings are selected to modify the flight paths of the ions such that ions of like mass and charge arrive at the second detector at the same time.

A TOF ion detector processor 238 includes a signal input that is electrically connected to the output of the discriminator 236. Also, the processor 238 is electrically connected to the second voltage power supply 210. The processor 238 performs control and measurement functions for the TOF ion detector 200. For example, the processor 238 triggers the second voltage power supply 210 to generate and apply a short pulse to the second mesh grid 208 that extracts ions from the region 212. In one method of operating, the short pulse is on order of one microsecond long. The short pulse is typically synchronized to the implant pulse. Also, the processor 238 acquires data from the ion detector 230 that is synchronized to the short pulse generated by the second voltage power supply 210. In addition, the processor 238 stores the data and generates a spectrum of relative amplitudes of the plasma ion population as a function of ion mass.

Plasma parameters, such as the type of ions, the ratios of particular ions to other particular ions, and the density of ions tend to drift for various reasons. For example, these parameters are strongly influenced by the conditions of the plasma chamber walls that are in direct contact with the plasma 118. The conditions of the plasma chamber walls tend to drift over time because they are constantly bombarded with ions and neutrals generated in the plasma 118. In addition, the fraction of ions in the plasma 118 and, therefore the ion density or ion flux, also tends to drift over time for various reasons. The drift in ion density or ion flux causes the ion implantation dose to drift over time, which makes the plasma doping process less repeatable.

Therefore, it is desirable to have active dosimetry, which takes real time in-situ measurement of the ion implantation dose and spectrum of ions in order to implement dose correction. These measurements can be used to trigger a corrective action to bring the process back within predetermined control limits or to trigger a maintenance event. For example, the corrective action can be a change in the process parameters, termination of the plasma doping process, or a maintenance event. Obtaining such real time in-situ measurements of the plasma chamber conditions is desirable because these measurements can improve yield and can significantly reduce the amount of routine maintenance performed in these systems.

Figure 3:
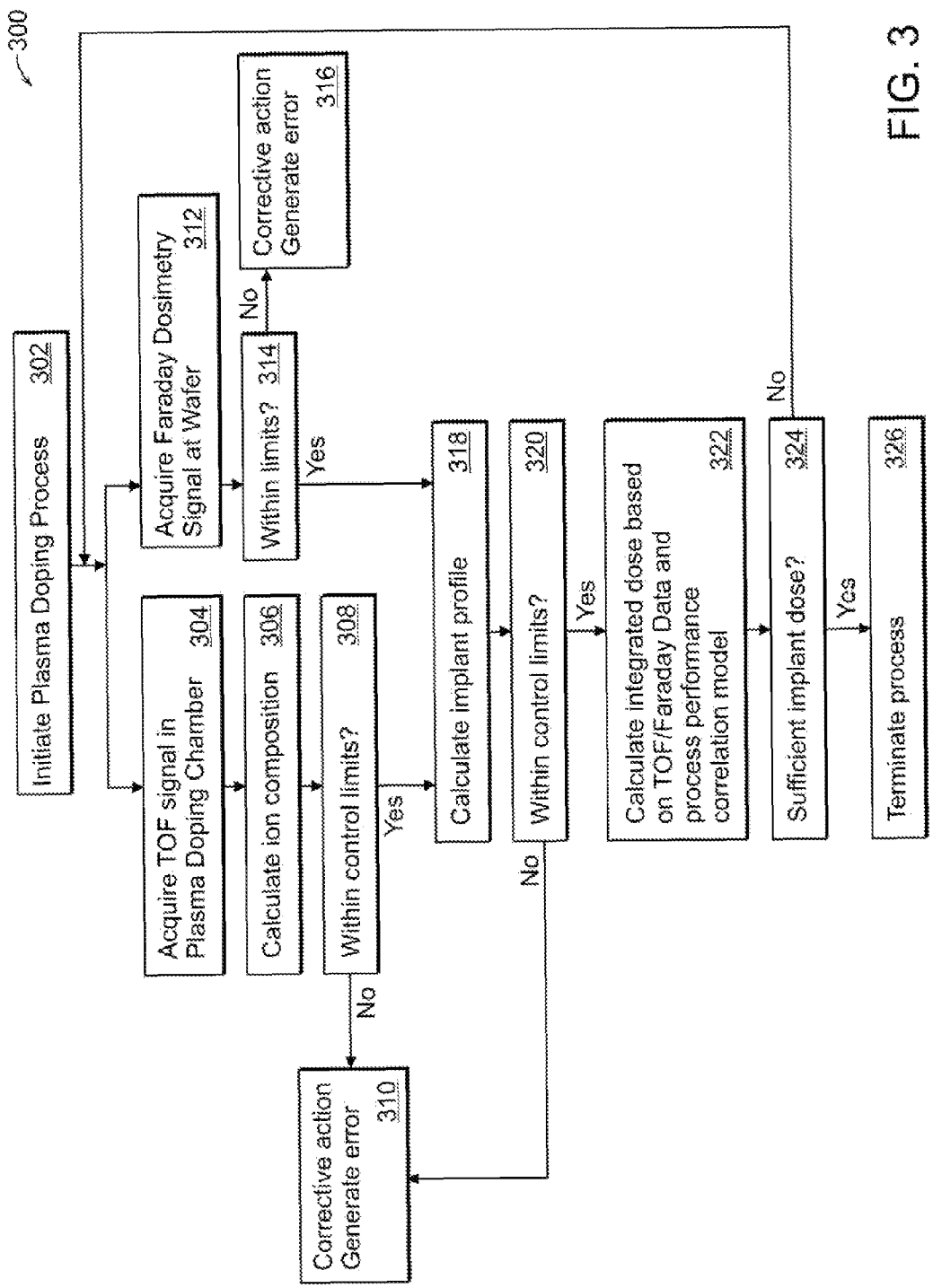
FIG. 3 illustrates a flow chart of an algorithm for implementing dose correction according to the present invention.

FIG. 3 illustrates a flow chart 300 of an algorithm for implementing dose correction according to the present invention. Referring to FIGS. 1, 2 and 3, in a first step 302, the substrate 106 to be doped is introduced into the process chamber 102 and then the doping process is initiated. In a second step 304, time-of-flight detector signals are acquired. The time-of-flight detector 124 can be synchronized with the bias pulse applied from the bias voltage power supply 122 to the platen 104 and the substrate 106 which attracts ions to the substrate 106 for plasma doping. The time of flight detector 124 can be configured to acquire a signal a plurality of times within each of the bias pulses.

In a third step 306, the process control computer 128 calculates a spectrum of relative amplitudes of the plasma ion population as a function of ion mass as described herein. In a fourth step 308, the computer 128 compares the spectrum of relative amplitudes of the plasma ion population as a function of ion mass with a model to determine if the plasma doping process is being performed within the required process specifications. If the computer 128 determines that the spectrum of relative amplitudes of the plasma ion population as a function of ion mass is not within the process specifications, then a fifth step 310 is performed where an error is generated and the process is either terminated or a corrective action is initiated.

Simultaneously with the second step 304, in a sixth step 312 Faraday dosimetry signals are acquired from the Faraday cup 108. The signals from the Faraday cup 108 are processed by the dose integration unit 110. The dose integration unit 110 generates signals that indicate the total charge on the Faraday cup 108, which can be a good metric of the total count of ions impacting the substrate 106 as described herein.

In a seventh step 314, the process control computer 128 compares the acquired Faraday dosimetry signals with a model to determine if the total number of ions impacting the substrate 106 are within the required process specifications. If the computer 128 determines that the total number of ions impacting the substrate 106 is not within the process specifications, then an eighth step 316 is performed where an error is generated and the process is either terminated or a corrective action is initiated.

In a ninth step 318, the process control computer 128 calculates the implant profile if the computer 128 determines that the spectrum of relative amplitudes of the plasma ion population as a function of ion mass is within the process specifications in the fourth step 308 and the computer 128 determines that total number of ions impacting the substrate 106 is within the process specifications in the seventh step 314. The computer 128 calculates the implant profile from the spectrum of relative amplitudes of the plasma ion population and from data for the total number of ions impacting the surface of the substrate 106. These data for the total number of ions impacting the surface of the substrate 106 can be obtained from either or both of the TOF ion detector 124 and the Faraday cup 108.

In a tenth step 320, the process control computer 128 compares the implant profile calculated in the ninth step 318 with a model and determines if the calculated implant profile is within the process specifications. If the computer 128 determines that implant profile calculated in the tenth step 320 is not within the process specification, then the fifth step 310 is performed where an error is generated and the process is either terminated or a corrective action is initiated.

If the process control computer 128 determines that the implant profile calculated in the tenth step 320 is within the process specification, then an eleventh step 322 is performed where the computer 128 calculates the integrated dose based on data obtained from the TOF detector 124 and calculations performed by the TOF ion detector processor 125. There are numerous ways of calculating the integrated dose according to the present invention.

The spectrum of relative amplitudes of the plasma ion population as a function of ion mass can be represented as an array of numbers. For example, the signal corresponding to plasma ions of a specific mass can be represented as the sum of ion counts in a range of array elements. The ratios of different ion species present in the plasma 118 can be represented as the ratio between the number of counts in a respective array element ranges. The process control computer 128 executes one or more algorithms using the data in the array to determine the integrated dose.

For example, the computer 128 execute algorithms to analyze a single peak value of the spectrum of relative amplitudes of the plasma ion population as a function of ion mass determined from the TOF ion detector processor 125. The signal peak value corresponds to the number of one particular ion in the plasma 118. In other embodiments, the computer 128 executes algorithms to analyze multiple peak values of the spectrum of relative amplitudes of the plasma ion population as a function of ion mass determined from the TOF ion detector processor 125. The multiple peak values correspond to relative numbers of particular ions in the plasma 118. In some embodiments, the computer 128 executes algorithms to analyze the multiple peak values to determine ratios of one particular type of ion to another particular type of ion.

In some embodiments, the integrated dose can be determined by comparing the spectrum of relative amplitudes of the plasma ion population as a function of ion mass and the total number of ions impacting the Faraday cup with one or more models. In various embodiments, the models can be obtained theoretically or experimentally.

For example, the ratio of ion mass species can be used to develop a model that relates ion mass species and ratios of ion mass species to process performance. The model can be used to predict the amount of dopant implanted into the wafer and to what depth it will be implanted. It can be experimentally determined that different ions created in particular plasmas will be implanted at different equivalent energies and to different depths.

In a twelfth step 324, the process control computer 128 determines if a sufficient implant dose has been implanted into the surface of the substrate 106. If the computer determines that a sufficient implant dose has not been implanted into the surface of the substrate 106, the process is repeated from the second step 304. However, if the computer 128 determines that a sufficient implant dose has been implanted into the surface of the substrate 106, the process is terminated.

The algorithm for implementing the dose correction described in connection with FIG. 3 is useful for monitoring plasma chamber conditions and performing fault detection in response to the monitoring. The stability and repeatability of a plasma doping process is highly dependent upon the physical conditions of the plasma chamber 102. For example, plasma parameters, such as the type of ions, the ratios or particular ions to other ions, and the density of ions are strongly influenced by the conditions of the plasma chamber walls that are in direct contact with the plasma 118. The conditions of the plasma chamber walls tend to drift over time because they are constantly bombarded with ions and neutrals generated in the plasma 118. Thus, in some embodiments of the present invention, the process control computer 128 monitors the data from the TOF ion detector processor 125 and determines if the type and density of ions present in the plasma 118 indicates that the chamber 102 needs to be cleaned or needs to be conditioned prior to initiating or continuing plasma doping.

The algorithm for implementing the dose correction described in connection with FIG. 3 is also useful for monitoring variations in the plasma and performing fault detection in response to the monitoring. The fraction of ions in the plasma 118 and, therefore, the ion density or ion flux tends to drift over time for various reasons. The drift in ion density or ion flux causes the ion implantation dose to drift over time, which makes the plasma doping process less repeatable.

In addition, the algorithm for implementing the dose correction described in connection with FIG. 3 is useful for monitoring the quality of incoming process gases and performing fault detection in response to the monitoring. In addition, the algorithm for implementing the dose correction described in connection with FIG. 3 is useful for determining if the gas feed is enriched or non-enriched. Distinguishing between enriched and non-enriched gases is needed to accurately resolve the implant dose into the wafer. As some gas feeds age, the composition of the gas changes. In order to accurately resolve the implant dose, it is necessary to know if a gas composition change occurs and/or if contamination is present in the gas.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, may be made therein without departing from the spirit and scope of the invention.

What is claimed is:

1. A method of controlling a plasma doping process using a time-of-flight ion detector, the method comprising:
   a. generating a plasma in a plasma chamber proximate to a platen supporting a substrate, the plasma comprising dopant ions;
   b. biasing the platen with a bias voltage waveform having a negative potential that attracts ions in the plasma to the substrate for plasma doping;
   c. measuring a spectrum of ions present in the plasma as a function of ion mass with a time-of-flight ion detector;
   d. analyzing the spectrum of ions as a function of ion mass to determine a relative number of at least one ion in the plasma; and
   e. modifying at least one plasma doping parameter in response to the analysis of the spectrum.

2. The method of claim 1 wherein the measuring the spectrum of ions comprises measuring a time that ions in the plasma take to traverse a known distance and then mapping the ion's flight time to the type of ion.

3. The method of claim 1 wherein the analyzing the spectrum of ions comprises comparing the spectrum of ions to a model spectrum of ions.

4. The method of claim 1 wherein the modifying at least one plasma doping parameter comprises terminating the plasma doping process.

5. The method of claim 1 wherein the modifying the at least one plasma doping parameter comprises modifying the bias voltage waveform that biases the platen.

6. The method of claim 1 wherein the modifying the at least one plasma doping parameter provides a dose correction to the substrate.

7. A method of controlling a plasma doping process using a time-of-flight ion detector, the method comprising:
   a. generating a plasma in a plasma chamber proximate to a platen supporting a substrate, the plasma comprising dopant ions;
   b. biasing the platen with a bias voltage waveform having a negative potential that attracts ions in the plasma to the substrate for plasma doping;
   c. measuring a spectrum of ions present in the plasma as a function of ion mass with a time-of-flight ion detector;
   d. determining an implant profile from the measured spectrum of ions as a function of ion mass; and
   e. modifying at least one plasma doping parameter in response to the implant profile.

8. The method of claim 7 wherein the measuring the spectrum of ions comprises measuring a time that ions in the plasma take to traverse a known distance and then mapping the ion's flight time to the type of ion.

9. The method of claim 7 wherein the determining the implant profile from the measured spectrum of ions comprises comparing the measured spectrum of ions to a model spectrum of ions.

10. The method of claim 7 wherein the determining the implant profile from the spectrum of ions comprises determining ratios of relative numbers of ions in the spectrum.

11. The method of claim 7 wherein the modifying at least one plasma doping parameter comprises terminating the plasma doping process.

12. The method of claim 7 wherein the modifying the at least one plasma doping parameter comprises modifying the bias voltage waveform that biases the platen.

13. The method of claim 7 wherein the modifying the at least one plasma doping parameter provides a dose correction to the substrate.

14. A method of controlling a plasma doping process using a time-of-flight ion detector, the method comprising:
   a. generating a plasma in a plasma chamber proximate to a platen supporting a substrate, the plasma comprising dopant ions;
   b. biasing the platen with a bias voltage waveform having a negative potential that attracts ions in the plasma to the substrate for plasma doping;
   c. measuring a spectrum of ions present in the plasma as a function of ion mass with a time-of-flight ion detector;
   d. measuring a total number ions impacting the substrate with a Faraday dosimetry system;
   e. determining an implant profile from the measured spectrum of ions; and
   f. determining an integrated dose from the measured total number of ions and the calculated implant profile; and
   g. modifying at least one plasma doping parameter in response to the calculated integrated dose.

15. The method of claim 14 wherein the measuring the spectrum of ions comprises measuring a time that ions in the plasma take to traverse a known distance and then mapping the ion's flight time to the type of ion.

16. The method of claim 14 wherein the determining an implant profile from the measured spectrum of ions comprises comparing the measured spectrum of ions to a model spectrum of ions.

17. The method of claim 14 wherein the determining an implant profile from the spectrum of ions comprises determining ratios of relative numbers of ions in the spectrum.

18. The method of claim 14 wherein the determining the integrated dose comprises comparing the implant profile and the measuring total number of ions to a model.

19. The method of claim 14 wherein the modifying at least one plasma doping parameter comprises terminating the plasma doping process.

20. The method of claim 14 wherein the modifying the at least one plasma doping parameter comprises modifying the bias voltage waveform that biases the platen.

21. The method of claim 14 wherein the modifying the at least one plasma doping parameter comprises providing a dose correction to the substrate.

22. The method of claim 14 wherein the modifying the at least one plasma doping parameter comprises modifying at least one of a chamber pressure and a process gas flow rate.

23. The method of claim 14 wherein the modifying the at least one plasma doping parameter comprises modifying at least one of an RF power and an RF voltage used for generating the plasma.

24. A plasma doping apparatus comprising:
   a. a chamber for containing a process gas;
   b. a plasma source that generates a plasma from the process gas;
   c. a platen that supports a substrate proximate to the plasma source for plasma doping;
   d. a time-of-flight ion detector that generates electrical signals representing the spectrum of ions present in the plasma as a function of ion mass;
   e. a bias voltage power supply having an output that is electrically connected to the platen, the bias voltage power supply generating a bias voltage waveform with a negative potential that attracts ions in the plasma to the substrate for plasma doping; and
   f. a processor having an input electrically connected to the time-of-flight ion detector and an output electrically connected to the bias voltage power supply, the processor generating a signal at the output in response to signals generated by the time-of-flight detector that provide a dose correction to the substrate.

25. The plasma doping apparatus of claim 24 further comprising a Faraday dosimetry system that measures a total number of ions impacting the substrate.

* * * * *